United States Patent [19]
Hirt et al.

[11] Patent Number: 5,883,830
[45] Date of Patent: *Mar. 16, 1999

[54] CMOS IMAGING DEVICE WITH INTEGRATED FLASH MEMORY IMAGE CORRECTION CIRCUITRY

[75] Inventors: Ray Hirt, Mesa; Matthew Rollender, Gilbert, both of Ariz.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 855,658

[22] Filed: May 13, 1997

Related U.S. Application Data

[63] Continuation of Ser. No. 581,403, Dec. 29, 1995, abandoned.

[51] Int. Cl.$^6$ .......................... G11C 11/34; G11C 11/36; H04N 3/14
[52] U.S. Cl. ................... 365/185.03; 365/185.33; 365/115; 348/294
[58] Field of Search ...................... 365/114, 115, 365/185.33, 185.03; 250/559.46, 208.1; 348/314, 294; 358/444

[56] References Cited

U.S. PATENT DOCUMENTS

| | | | |
|---|---|---|---|
| 5,164,603 | 11/1992 | Hartman et al. | 250/559.46 |
| 5,247,166 | 9/1993 | Cannon et al. | 250/208.1 |
| 5,272,535 | 12/1993 | Elabd | 348/314 |
| 5,461,425 | 10/1995 | Fowler et al. . | |
| 5,502,576 | 3/1996 | Ramsay et al. | 358/444 |
| 5,638,320 | 6/1997 | Wong et al. | 365/185.03 |

OTHER PUBLICATIONS

Microelectronics, Second Edition; Jacob Millman, Arvin Grabel; 1988; pp. 200–201.

*Primary Examiner*—David Nelms
*Assistant Examiner*—Trong Phan
*Attorney, Agent, or Firm*—Blakely, Sokoloff, Taylor & Zafman LLP

[57] ABSTRACT

The CMOS image sensing device includes, on one integrated circuit, a sensor array and compensation circuitry for adjusting signals output from the sensor array to compensate for output signal variations, such as variations caused by voltage, temperature, process or manufacturing variations. The integrated circuit also includes logic circuitry for performing image processing operations on signals output from the sensor array including, for example, pattern recognition operations or filtering operations. In one embodiment, the integrated circuit includes a flash programmable memory array for storing compensation values corresponding to individual pixel elements of the sensor array. In use, the sensor array is illuminated by a flat light source, variations among the magnitude of analog output signals from the elements are detected and corresponding compensation values are calculated. The compensation values are flash programmed into the memory array. Thereafter, analog signals output from the sensor array are adjusted in accordance with the compensation values. In another arrangement, a separate flash programmable memory array is not provided. Rather, individual drive transistors of the pixel elements of the sensor array portion are directly flash programmed to achieve compensation. Passive and active photo detection pixel elements having flash programmable drive transistors are described.

13 Claims, 6 Drawing Sheets

CMOS IMAGING DEVICE WITH INTEGRATED FLASH MEMORY IMAGE CORRECTION CIRCUITRY

This is a Continuation of application Ser. No. 08/581,403, filed Dec. 29, 1995, now abandoned.

BACKGROUND OF THE INVENTION

1. Field of the Invention

The invention generally relates to imaging devices and particularly to integrated circuit imaging devices requiring compensation for process and other variations.

2. Description of Related Art

Integrated circuit imaging devices include an array of light detecting elements interconnected to generate analog signals representative of an image illuminating the device. One common example of an integrated circuit imaging device is a charge coupled device (CCD) which is relatively expensive and consumes a relatively large amount of power. An alternative integrated circuit imaging device employs complementary metal oxide semiconductor (CMOS) image sensing elements. Within such an integrated circuit, a CMOS photo diode or photo transistor is employed as a light detecting element. In one example, conductivity of the element varies in accordance with the intensity of light illuminating the element. In other example, charge is collected in accordance with the intensity of light illuminating the element. By conducting current through the element or storing charge, an analog signal is thus generated having a magnitude approximately proportional to the intensity of light illuminating the element. CMOS integrated circuit imaging devices are considerably cheaper than CCD-type devices and may consume less power.

Both the CCD and CMOS integrated circuit imaging devices may require compensation for differences caused by variations within the integrated circuits, such as process, temperature, manufacturing, or voltage variations. For example, two different CCD elements within a single integrated circuit may generate analog signals of differing magnitudes for the same intensity of light illumination. Likewise, two CMOS photo diodes or photo transistors may generate analog signals of differing magnitudes when illuminated by light of equal intensity. As such, when exposed to a flat light image having equal intensities throughout, typical CMOS or CCD arrays may output analog signals having significant magnitude variations. Accordingly, if the analog signals are used to reproduce the original image, the reproduced image will not match the original flat image but will include a significant amount of variability and noise.

To eliminate this problem, imaging devices incorporating CCDs or CMOS photo diodes or photo transistors often include a compensation system for detecting and compensating for differences among the individual imaging elements. In one arrangement, a separate integrated circuit is provided with a random access memory (RAM). The integrated circuit containing the CCD or CMOS imaging elements is exposed to a flat image. Analog signals generated therefrom are converted to digital signals and binary compensation values representative of those signals are calculated and stored within the RAM. Thereafter, during use, analog signals received from the CCD or CMOS imaging array are converted to digital signals then adjusted in accordance with the binary values stored within the corresponding RAM array to compensate for any inherent variations between the sensing elements to thereby eliminate the aforementioned variability and noise. As such, if once again exposed to flat light, analog images output from the overall system are adjusted to match the flat input image.

Typically, such systems include, in addition to the integrated circuit imaging array and the separate RAM array, a separate controller circuit and a separate image processing logic circuit. The controller circuit controls generation of the compensation values for storage within the RAM array and the application of those values for adjusting subsequent images. The controller may also provide timing signals for the proper clocking of the imaging array. The image processing logic may include, for example, logic for filtering the image or otherwise manipulating the image to perform pattern recognition and the like.

Thus, typical integrated circuit imaging devices often include separate integrated circuits for the imaging array, the RAM, the compensation controller and the image processing logic. The provision of separate integrated circuits for the various components, and corresponding separate packaging elements, results in a fairly high cost for the overall system. Moreover, the need to transmit signals from one integrated circuit to the other can result in a relatively slow processing times, particularly for imaging arrays having a large number of elements such as a 1024-by-1024 array and higher.

It would be desirable to provide an improved integrated circuit imaging system which overcomes these disadvantages.

SUMMARY OF THE INVENTION

In accordance with one aspect of the invention, an integrated circuit imaging device is provided with a sensor array, a flash programmable memory array, and a controller circuit for controlling operation of the sensor array and the flash programmable memory array, with the sensor array, the memory array and the controller circuit all formed on a single integrated circuit chip.

In one embodiment, the integrated circuit is formed using a CMOS process. The sensor array is composed of a plurality of individual CMOS photo diode or photo transistor elements. The flash programmable memory array is composed of a plurality of individual memory storage locations each capable of storing a binary value sufficient to accommodate a compensation value. The controller circuit is connected to the sensor array and to the flash programmable memory array. The controller circuit includes circuitry for receiving analog signals from the sensor array responsive to a flat image illumination, or other known image, and for generating compensation values therefrom. The controller circuit also includes circuitry for flash programming the memory array to store the compensation values. Moreover, the controller circuitry includes circuitry for receiving signals corresponding to subsequent images illuminating the sensor array and for adjusting the signals in accordance with the compensation values stored within the flash programmable memory array for outputting a compensated set of signals.

In the exemplary implementation, the single integrated circuit also includes a logic circuit for processing or manipulating the set of signals output from the controller circuit to, for example, perform pattern recognition or the like. The single IC also provides timing signals for the proper clocking of the imaging array.

In accordance with another aspect of the invention, a single integrated circuit imaging device is provided wherein individual CMOS imaging elements, such as photo diodes or photo transistors, are directly flash programmed to achieve direct compensation. As with the exemplary embodiment above, the single integrated circuit is provided with a sensor array of CMOS photo diodes or photo transistors and a controller circuit for receiving signals from the imaging array and for generating compensation values therefrom. However, rather than providing a separate flash programmable memory array for storing the compensation values, the controller circuit applies the compensation values to directly flash program the CMOS photo diodes or photo transistors.

In one example, each individual CMOS imaging element is an active photo diode device having a photo diode, a drive transistor and a multiplexer. A gate of the drive transistor is connected to an output of the multiplexer. A first input of the multiplexer is connected to the photo diode. A second input of the multiplexer is connected to the controller circuit. The multiplexer is controlled by a selection signal provided by a selection line also connected to the controller circuit. For flash programming of the device, the multiplexer is controlled to select the input from the control circuit which provides a voltage signal sufficient to perform flash programming of the gate of the drive transistor, perhaps by hot-ion injection. The flash programming of the drive transistor causes a change in the electrical characteristics of the drive transistor to change the strength of the drive transistor by an amount proportional to the compensation value determined for that imaging element. Thereafter, the multiplexer is controlled to direct signals from the photo diode to the gate of the drive transistor. Current drawn by the drive transistor is therefore modulated by the intensity of light illuminating the photo diode with automatic and immediate compensation. In other embodiments, passive CMOS photo detection elements may be employed.

DETAILED DESCRIPTION OF THE PREFERRED EMBODIMENTS

With reference to the remaining Figures, exemplary embodiments of the invention will now be described. The exemplary embodiments are described primarily with reference to block diagrams and flowcharts. As to the flowcharts, each block within the flowcharts represents both the method step and an apparatus element for performing the method step. Herein, the apparatus element may be referred to as a means for, an element for, or a unit for performing the method step. As to the block diagrams, it should be appreciated that not all components necessary for a complete implementation of a practical system are illustrated or described in detail. Rather, only those components necessary for a thorough understanding of the invention are illustrated and described. Furthermore, components which are either conventional or may be readily designed and fabricated in accordance with the teachings provided herein are not described in detail.

Figure 1:
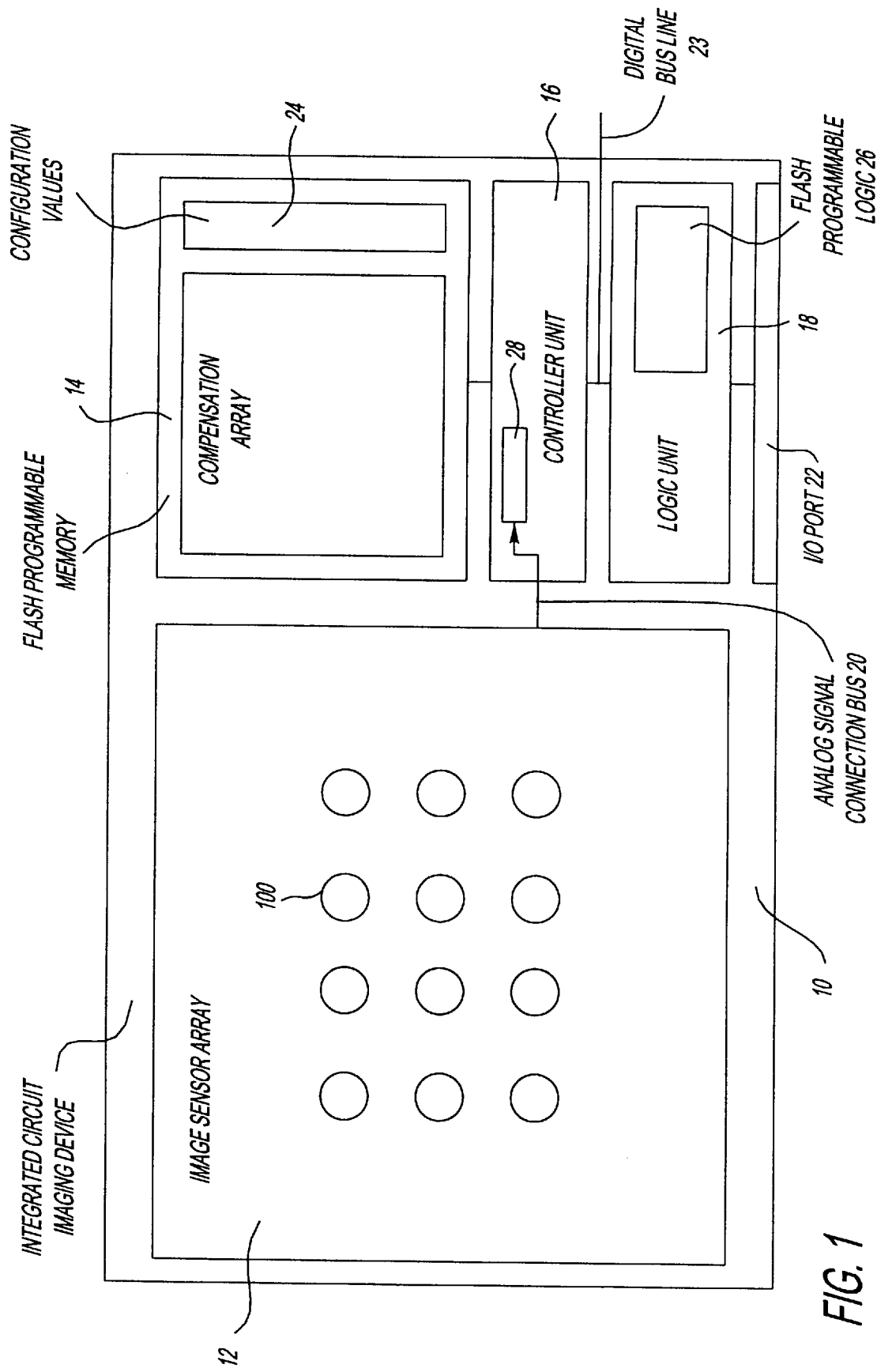
FIG. 1 is a block diagram illustrating a CMOS integrated circuit imaging device configured in accordance with a first exemplary embodiment of the invention.

FIG. 1 illustrates a single integrated chip 10 formed from a CMOS process and having an image sensor array 12, a flash programmable memory 14, a controller unit 16 and a logic unit 18. Sensor array 12 includes a grid of individual CMOS light sensing elements 100 configured to output analog signals representative of an amount of light intensity illuminating the elements to controller 16 along an analog signal connection bus 20. Depending upon the configuration, analog signals from elements of array 12 may be output simultaneously in parallel, output one at a time in series, or output row-by-row or column-by-column, etc. Controller circuitry includes analog-to-digital (A/D) circuitry, not separately shown, for converting analog signals received from sensor array 12 to digital signals. The digital signals are routed along a digital bus line 23 to logic unit 18 for further processing. Logic unit 18, depending upon the configuration, performs one of a wide variety of image processing operations including, for example, pattern recognition operations, filtering operations, Fourier transform operations, and the like.

Resulting digital signals are output from circuit 10 through a digital I/O port 22. Depending upon the implementation, the content and format of the digital output signals may differ. For many applications, it may be desirable to output an entire input image, perhaps filtered, in digital form. In other words, one digital value is output for each corresponding element of sensor array 12. In other implementations, it may be desirable to output only digital values resulting from operations performed by the logic circuit on the image detected by array 12. For example, for a pattern recognition application, it may be desirable to output signals identifying whether a particular pattern is recognized or not. In still other applications, it may be desirable to output compressed versions of the detected image. For example, although sensor array 12 may provide a 1024-by-1024 array of elements, logic unit 18 may output digital values corresponding to only a 512-by-512 compressed array. As can be appreciated, a wide range of digital output signals and formats may be employed corresponding to a wide range of functions or operations that may be performed by logic unit 18. For most applications, logic unit 18 is preconfigured to perform only one particular operation on the detected image. In other embodiments, however, the logic unit may be configured to perform one of several operations with the particular operation being selected by an input signal received from digital I/O port 22.

Flash memory array 14 includes an array of individual memory locations for storing compensation values for corresponding elements of sensor array 12. For example, if sensor array 12 is 1024-by-1024 array, then flash memory 14 includes a 1024-by-1024 array of storage locations for storing compensation values. Depending upon the implementation, each compensation value may be 4 bits, 8 bits, etc. The choice of the number of bits for each compensation value depends upon the desired precision for compensation. In some implementations, each compensation value may be only 2 or 3 bits.

The arrangement of compensation values within flash memory 14 may be entirely arbitrary so long as each compensation value can be matched with a corresponding element of the sensor array. In other words, whereas the sensor array requires a physically 2-dimensional layout to allow a 2-dimensional image to be detected, the flash memory does not require any corresponding 2-dimensional physical layout.

Figure 8:
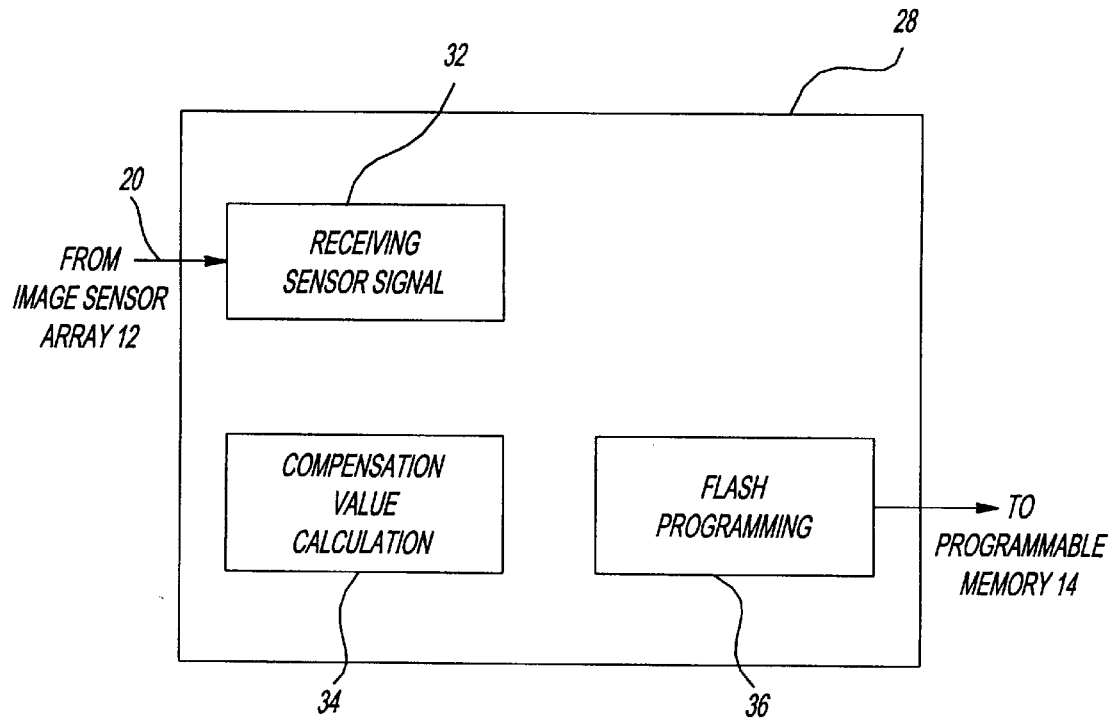
FIG. 8 is a block diagram of a flash programming unit used with the embodiment of the invention in FIG. 1.

In use, sensor array 12 is exposed to a flat light field or a field of known light intensity variation. Signals generated by the sensor element are transmitted to controller 16 which calculates compensation values in response thereto. The calculation of compensation value may be entirely in accordance with conventional techniques. FIG. 8 shows a flash programming unit 28 as part of the controller 16 used with the embodiment of the invention in FIG. 1. The unit 28 includes means for receiving signal values 32 from the sensor array means representative of a flat light image exposed to the sensor array, means for calculating compensation values 34 based upon differences among the signal values provided by individual pixel elements of the sensor array means, and means for flash programming 38 the flash programmable means based upon the calculated compensation values for use in compensating for differences among the individual pixel elements of the sensor array. Controller 16 then transmits the compensation values to flash memory 14 for flash programming therein, perhaps using hot-ion injection techniques. Controller 16 includes flash programming unit 28. FIG. 8 shows the flash programming unit 28 having a sensor signal receiving block 32 and a compensation value calculation block 34. Flash programming means 36 uses the compensation values to program memory 14. Again, such can be in accordance with conventional techniques. Depending upon the implementation, actual flash programming of memory 14 may require an iterative programming process whereby elements are programmed, then tested to determine whether the correct values are programmed and, if not, reprogrammed. Thereafter, integrated circuit 10 operates in the manner described above wherein sensor array 12 is exposed to an image and controller 16 adjusts signals output from the sensor array in accordance with corresponding compensation values from the flash memory array. Flash programming of the memory array is preferably performed at a factory following fabrication of the integrated circuit. However, in other circumstances, it may be desirable for customers to flash program the memory cells.

Figure 2:
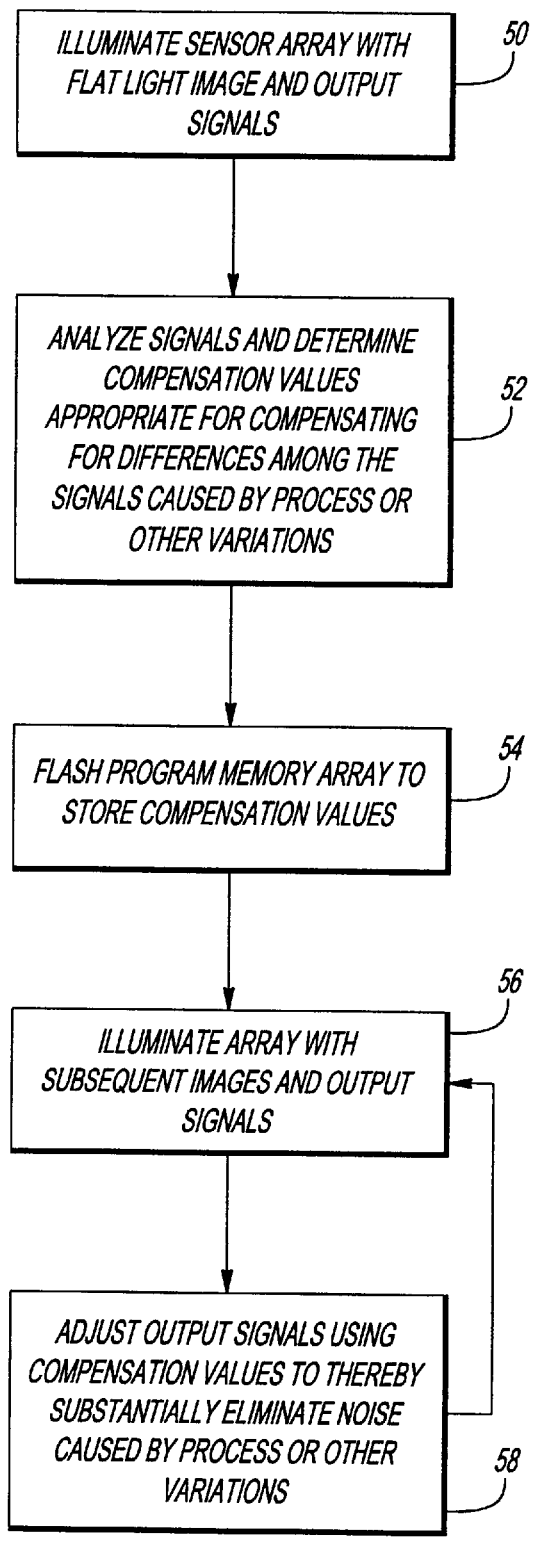
FIG. 2 is a flowchart illustrating a method for processing images using the integrated circuit imaging device of FIG. 1.

FIG. 2 is a flowchart summarizing the above-described method for operating integrated circuit 10. Initially, at step 50, the sensor array of the integrated circuit is illuminated by a flat image. Next, at step 52, the controller 16 calculates compensation values for each of the pixels of the sensor array for use in eliminating variations in output signals from the pixels. Next, at step 54, the memory 14 is flash programmed to record the compensation values. Thereafter, at step 56, the sensor array is illuminated by a subsequent image which may be, for example, an image subject to pattern recognition. At step 58, the controller 16 adjusts individual signals received from the sensor array with corresponding compensation values from the memory 14 to generate an adjusted set of signals and thereby substantially eliminate noise from the detected image represented by the signals.

Referring again to FIG. 1, thus far, an integrated circuit has been described wherein a portion of the circuit is employed as flash memory for storing compensation values. Additionally, however, other portions of the circuit may be employed as flash memory for storing other values as well. For example, portions of memory 14 may be employed for storing configuration values perhaps directed towards particular applications. For example, if the integrated circuit is intended for use within a video camera, then certain configuration values useful in such an application are stored within the flash memory. On the other hand, if the integrated circuit is intended for use within a medical imaging device, then alternative configuration values are stored. As can be appreciated, a wide range of values may be flash programmed to facilitate a wide range of applications. In FIG. 1, a portion of flash memory 14, identified by reference numeral 24, stores such configuration values.

Other portions of the integrated circuit may be flash programmed as well. For example, portions of logic unit 18 may be flash programmed to perform specific operations directed towards particular applications. For pattern recognition operations, for example, certain patterns to be recognized may be flash programmed into a portion of the logic circuit or into a secondary memory (not separately shown) connected thereto. In other implementations, logic unit 18 may be capable of performing a number of different operations and portions thereof are flash programmed to select one of the specific operations. Within FIG. 1, a portion of logic unit 18 subject to flash programming is identified by reference numeral 26.

Figure 3:
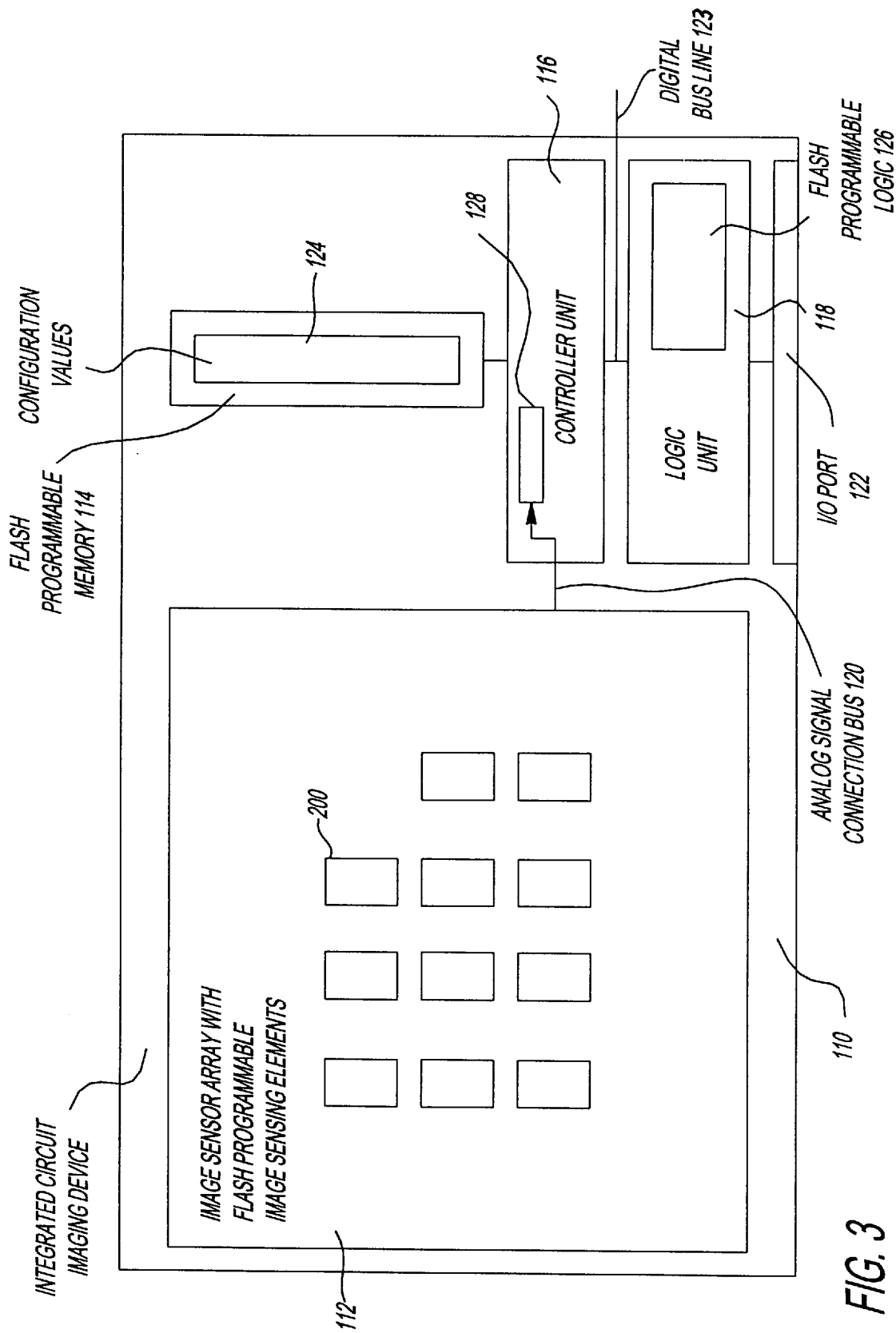
FIG. 3 is a block diagram of an alternative integrated circuit imaging device.

Thus, other portions of integrated circuit 10 besides flash memory 14 may be flash programmed as needed. Indeed, even sensor array 12 may be flash programmed. In the following, embodiments are described wherein individual elements of a sensor array are flash programmed to perform direct compensation without requiring a separate flash memory storing compensation values. This embodiment is illustrated in FIGS. 3–7. FIG. 3 illustrates an alternative integrated circuit to that of FIG. 1. The circuit of FIG. 3 is similar to that of FIG. 1 and like components are represented by like reference numerals incremented by 100. Only pertinent differences between the embodiments will be described.

Figure 9:
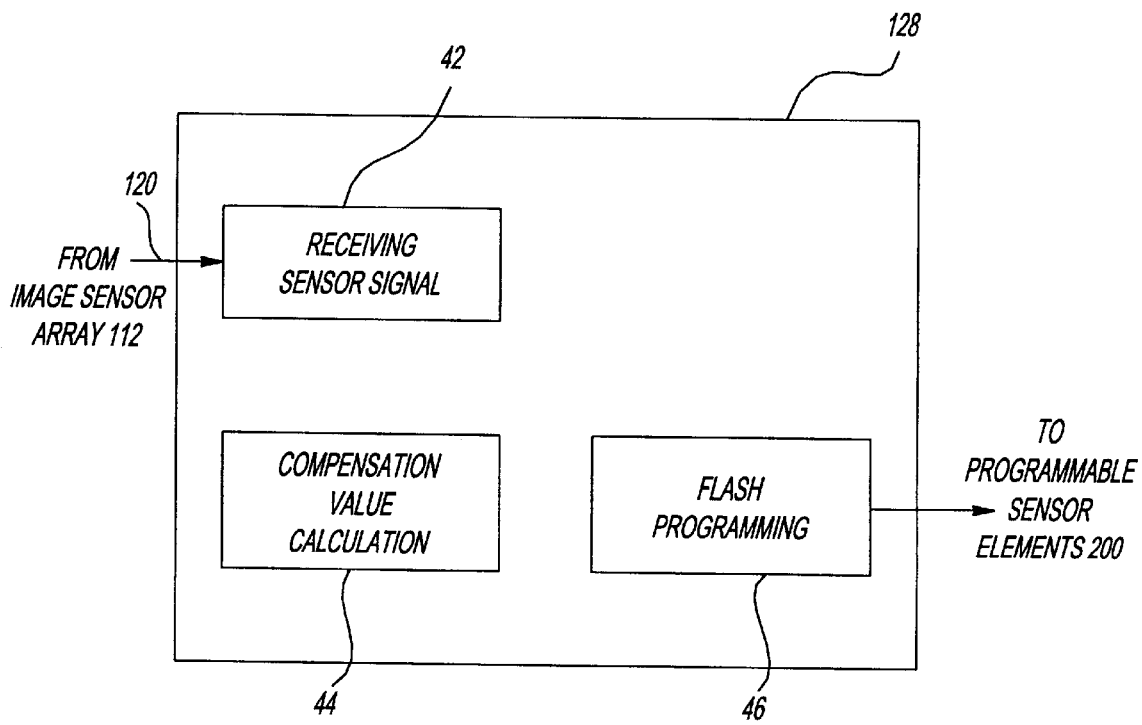
FIG. 9 is a block diagram of a flash programming unit used with the embodiment of the invention in FIG. 3.

FIG. 3 illustrates the integrated circuit 110 having a sensor array 112, a controller 116 and a logic unit 118. Sensor array 112 includes a 2-dimensional array of individual sensor elements 200 having drive transistor devices directly flash programmed by the flash programming unit 128 in controller 116 to perform direct compensation. As such, a separate flash memory array is not required. FIG. 9 shows a flash programming unit 128 in controller circuit 116. The unit 128 comprises means for receiving signal values 42 from the sensor array means representative of a flat light image exposed to the sensor array, means for calculating compensation values 44 based upon differences among the signal values provided by individual pixel elements of the sensor array means, and means for flash programming 46 the flash programmable means based upon the calculated compensation values for use in compensating for differences among the individual pixel elements of the sensor array. In all other respects, integrated circuit 110 may operate in the same manner as integrated circuit 10.

Figure 4:
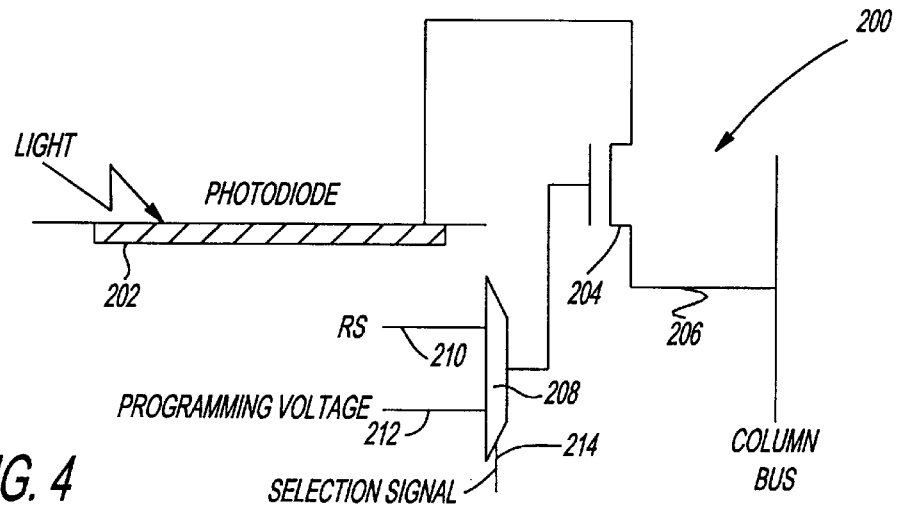
FIG. 4 is a circuit schematic of a passive photo diode sensor element for use with the integrated circuit of FIG. 3.
Figure 5:
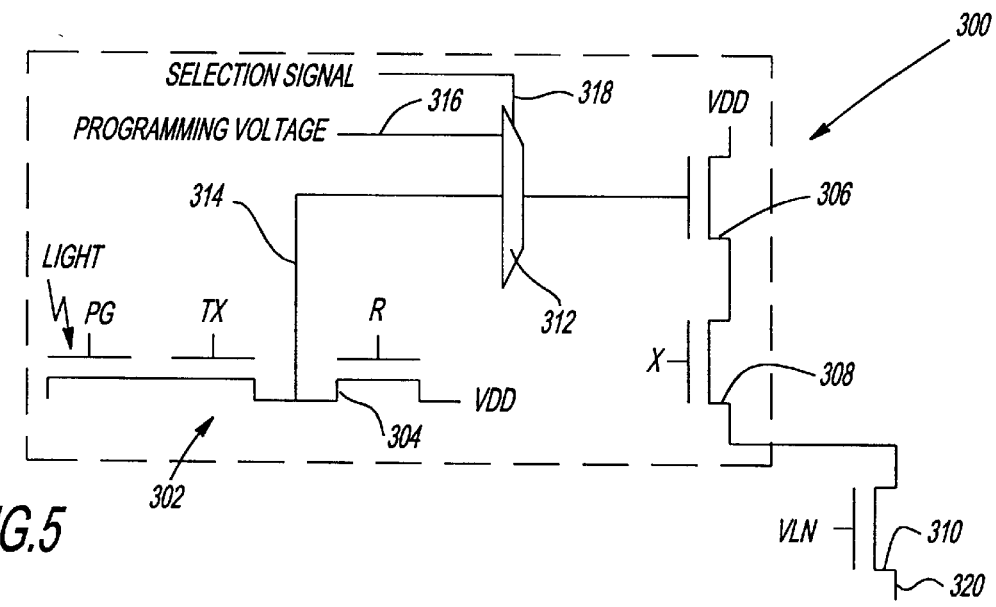
FIG. 5 is a circuit schematic of an active photo gate sensor element for use with the integrated circuit of FIG. 3.
Figure 6:
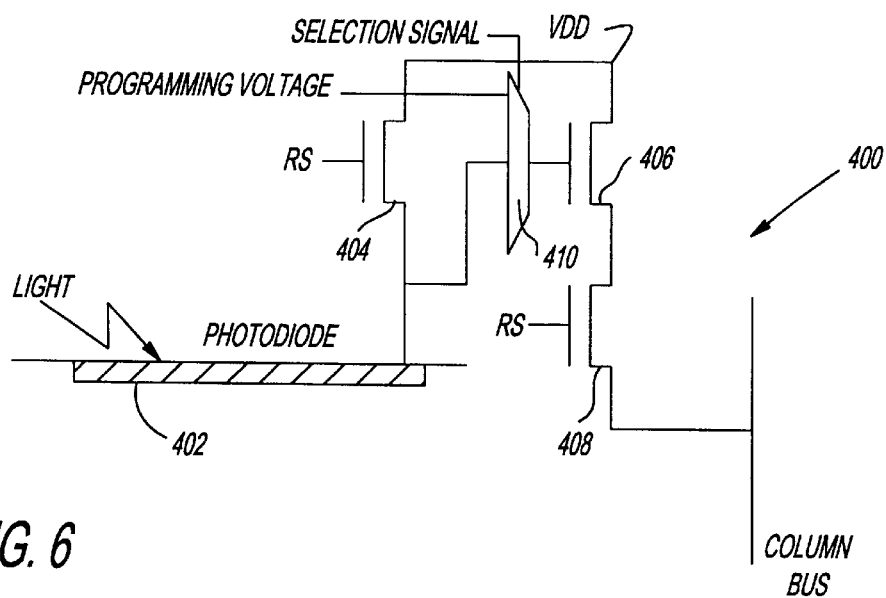
FIG. 6 is a circuit schematic of an active photo diode sensor element for use with the integrated circuit of FIG. 3.

Depending upon the implementation, the individual photo detecting elements of sensor array 112 may differ. FIGS. 4–6 illustrate examples of CMOS photo detection elements that may be appropriate for various applications. FIG. 4, for example, illustrates a passive pixel photo detection element 200 having a photo diode 202 and an NMOS drive transistor 204. Transistor 204 is connected between photo diode 202 and an output line 206 which joins a column bus. A gate of transistor 204 is connected to the output of the multiplexer 208 which receives either a row strobe signal RS along a line 210 or a flash programming voltage signal along line 212. Multiplexer 208 is controlled by a selection signal along select line 214. Lines 210, 212 and 214 are all connected to the controller circuit. In use, to flash program the pixel element, the controller circuit transmits a signal along line 214 selecting the input from 212 then transmits a programming voltage along line 212 to program transistor 204. The gate of transistor 204 is physically modified by the programming voltage to modify the electrical characteristics of the transistor to reduce its drive strength by an amount sufficient to compensate for variations in photo diode 202. Thereafter, mutliplexer 208 is controlled to receive signals along line 210 for selecting the photo diode during use via a conventional row strobe signal.

FIG. 5 illustrates an active pixel arrangement employing a photo gate light detection element subject to flash programming. More specifically, FIG. 5 illustrates a pixel element 300 having a photo gate 302 with inputs PG and TX and a set of NMOS transistors 304, 306, 308 and 310 connected as shown. Transistor 308 has a gate receiving a signal X. Transistor 310 is connected to output of transistor 308 at one end and voltage source VSS at another and its gate receiving a signal VLN. Transistor 304, with a gate receiving a signal R, is connected to photo diode 302 at one end and voltage source VDD at another. Transistor 306 is connected between a voltage source VDD and a selection transistor 308 and operates as a drive transistor. Drive transistor 306 has a gate connected to the output of a multiplexer 312. When input of the multiplexer 312 is connected to an output of photo diode 302 along a line 314, another input of multiplexer 312 is connected to the controller circuitry along line 316 for receiving a flash programming signal. Multiplexer 312 is controlled by a selection signal provided along a selection line 318 also connected to the controller circuitry. As with the passive pixel arrangement of FIG. 4, the multiplexer of the photo gate arrangement of FIG. 5 is controlled to transmit a flash programming signal to a gate of drive transistor 306 to alter the electrical characteristics of the drive transistor to achieve compensation. Thereafter, the multiplexer is controlled to transmit output signals from the photo diode to the gate of the drive transistor which controls generation of an output signal for transmission to the controller circuitry along an output line 320.

FIG. 6 illustrates an active pixel arrangement employing a photo diode rather than a photo gate. More specifically, FIG. 6 illustrates a photo diode pixel element 400 having a photo diode 402 and a set of three NMOS transistors 404, 406 and 408. NMOS transistor 406 operates as a drive transistor. As with the arrangement of FIG. 5, a gate of the drive transistor is connected to the output of the multiplexer which receives, along one input, an output from the photo diode and receives along another input, a flash programming signal from the controller circuit. The multiplexer is controlled by a selection signal also received from the controller circuit. The active photo diode arrangement of FIG. 6 operates similarly to the active photo gate arrangement of FIG. 5 and such operation will not be redescribed.

Figure 7:
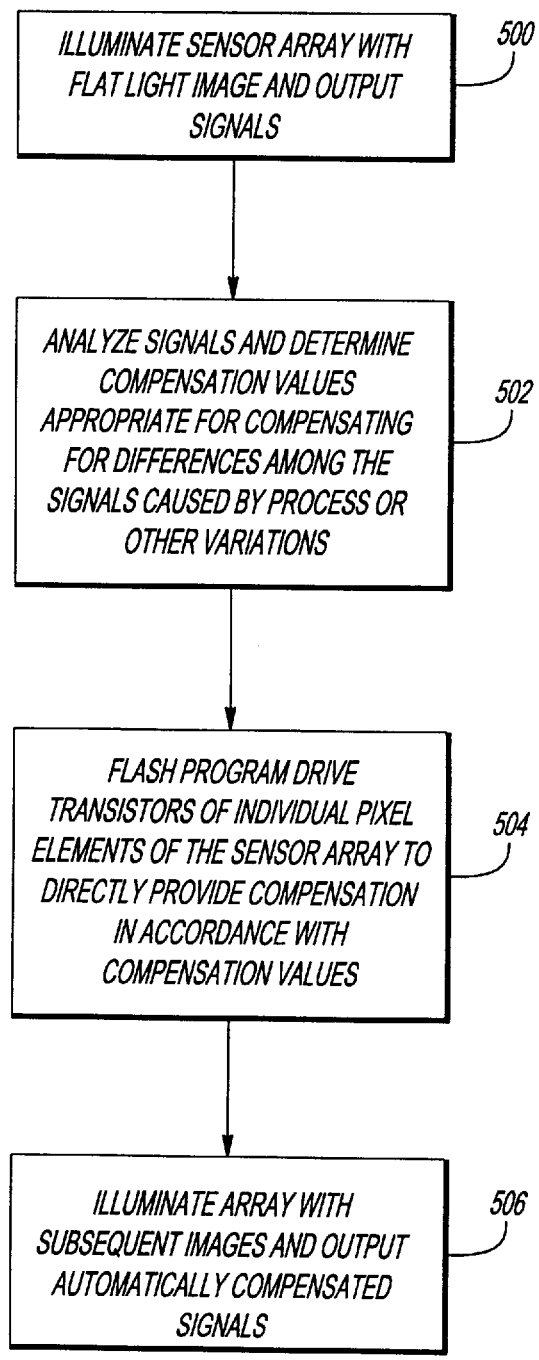
FIG. 7 is a flowchart illustrating a method for processing images using the integrated circuit imaging device of FIG. 3.

FIG. 7 is a flowchart summarizing the operation of the integrated circuit of FIG. 3. Initially, at step 500, the sensor array is illuminated by a flat light image. Next, at step 502, the controller circuit calculates compensation values, one per pixel of the sensor array, for use in compensating for differences among the output signals of the pixels. Thereafter, at step 504, drive transistors of the individual pixel elements of the sensor array are directly flash programmed to alter the electrical characteristics of the drive transistors by an amount related to the corresponding compensation values. Thereafter, at step 506, the sensor array is illuminated by a subsequent image and analog signals generated by individual pixels of the sensor array are automatically adjusted, as a result of the flash programming of the drive transistors, to provide automatic image compensation.

What has been described are various embodiments of an integrated circuit CMOS imaging detection device having all necessary components integrated onto a single circuit rather than provided on several separate chips. Compensation for variations among individual photo detection elements, such as process variations, is achieved by flash programming portions of the integrated circuit. In one arrangement, a flash memory is provided for storing compensation values. In another arrangement, drive transistors of individual photo detection elements of the sensor array are directly flash programmed to achieve direct compensation. Other arrangements are also possible consistent with the general principles of the invention.

Also although described primarily with respect to an integrated circuit having a 2-dimensional sensor array, other sensor configurations are possible. For example, in some embodiments, only a single sensor pixel or line of pixels may be employed. The exemplary embodiments described herein are intended merely to illustrate principles of the invention and should not be construed as limiting the scope of the invention.

What is claimed is:

1. A single integrated circuit comprising:
   a sensor array having a plurality of individual pixel sensor elements for outputting signals representative of an input light;
   a flash programmable memory array for storing compensation values for adjusting the signals; and
   a controller circuit for receiving the signals and for adjusting the signals in accordance with the compensation values stored within the flash array to obtain image data representing the input light.

2. A single integrated circuit comprising:
   sensor array means for sensing incident light and for outputting signals in response thereto;
   flash programmable means for storing compensation values for use in adjusting the signals output from the sensor array means; and
   controller means for controlling operation of the sensor array and the flash programmable means, and for adjusting the signals in accordance with the compensation values to obtain image data representing the incidental light.

3. The single integrated circuit of claim 2 wherein the flash programmable means comprises:
   a flash programmable memory array for storing compensation values for use in compensating for noise among signals generated by the sensor array means caused by process variations in the integrated circuit.

4. The single integrated circuit of claim 2
   wherein said sensor array means comprises a plurality of individual photosensitive detector circuits; and
   wherein said flash programmable means includes a separate individual flash programmable compensation circuit connected to each of said individual photosensitive detector circuits of said sensor array means, said individual flash programmable compensation circuits configured to compensate for analog signal values generated by the corresponding photosensitive detector circuit.

5. The single integrated circuit of claim 2 wherein said controller means includes a flash programming unit for flash programming the flash programmable means.

6. The single integrated circuit of claim 5 wherein the flash programming unit is configured to receive signal values from the sensor array means representative of a flat light image of an object exposed to the sensor array, calculate compensation values based upon differences among the signal values provided by individual pixel elements of the sensor array means, and flash program the flash programmable means based upon the calculated compensation values for use in compensating for differences among the individual pixel elements of the sensor array.

7. The single integrated circuit of claim 4 wherein each individual photosensitive detector circuit includes a photo diode having an input connected to a voltage source and wherein each of said individual compensation circuits includes a multiplexer having a first input connected to an output of the corresponding photo diode and a second input connected to a flash programming voltage, and an output connected to an output transistor of the photosensitive detector circuit.

8. A method for processing images detected by an integrated circuit having a sensor array and a flash programmable memory array, said method comprising the steps of:

illuminating the sensor array with a known image;

analyzing responsive signals generated by the sensor array and generating compensation values therefrom;

flash programming the memory array to store the compensation values;

illuminating the sensor array with a subsequent image; and adjusting responsive signals from the sensor array using the compensation values from the memory array to obtain data representing the subsequent image.

9. The method of claim 8 wherein the known image is a flat light image.

10. The method of claim 8 wherein the step of analyzing the responsive signals and generating compensation values comprises the steps of:

comparing the responsive signals with expected signals to determine differences therebetween and generating compensation values representative of said differences.

11. A method for processing images detected by an integrated circuit having a sensor array with individual pixel elements having flash programmable drive transistors, said method comprising the steps of:

illuminating the sensor array by a known image;

analyzing responsive signals generated by the sensor array and generating compensation values therefrom;

flash programming the drive transistors of the individual pixel elements in accordance with corresponding compensation values; and illuminating the sensor array by a subsequent image and generating signals responsive thereto, said signals being automatically adjusted in accordance with the compensation values as a result of the flash programmed drive transistors to obtain data representing the subsequent image.

12. The method of claim 11 wherein the step of analyzing the responsive signals and generating compensation values comprises the steps of:

comparing the responsive signals with expected signals to determine differences therebetween and generating compensation values representative of said differences.

13. An image sensor circuit comprising:

a sensor array located on an integrated circuit (IC) chip and having a plurality of individual CMOS pixel elements for outputting electrical signals representative of light incident upon the sensor array;

a flash programmable memory located on the IC chip and for storing compensation values for adjusting the signals; and a controller for receiving the signals and for adjusting the signals in accordance with the compensation values stored within the memory to obtain data representing the incident light.

* * * * *